US012573597B2

(12) United States Patent
    Kato

(10) Patent No.:  US 12,573,597 B2
(45) Date of Patent:      Mar. 10, 2026

(54) PLASMA PROCESSING APPARATUS AND ELECTROSTATIC CHUCK

(71) Applicant: Tokyo Electron Limited, Tokyo (JP)

(72) Inventor: Makoto Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 141 days.

(21) Appl. No.: 18/231,251

(22) Filed: Aug. 8, 2023

(65) Prior Publication Data

US 2024/0047182 A1      Feb. 8, 2024

(30) Foreign Application Priority Data

Aug. 8, 2022    (JP) ................................. 2022-126266

(51) Int. Cl.
    *H01J 37/32*        (2006.01)
    *H01L 21/683*        (2006.01)
(52) U.S. Cl.
    CPC .. *H01J 37/32724* (2013.01); *H01J 37/32082* (2013.01); *H01J 37/3244* (2013.01); *H01J 37/32568* (2013.01); *H01J 37/32642* (2013.01); *H01L 21/6833* (2013.01)
(58) Field of Classification Search
    CPC ........... H01J 37/32724; H01J 37/32082; H01J 37/3244; H01J 37/32568; H01J 37/32642; H01L 21/6833
    See application file for complete search history.

(56) References Cited

U.S. PATENT DOCUMENTS

| | | | |
|---|---|---|---|
| 6,581,275 B2 | 6/2003 | Narendrnath et al. | |
| 2018/0350561 A1* | 12/2018 | Yamaguchi | ......... H01L 21/6831 |
| 2020/0286717 A1* | 9/2020 | Cho | ................. H01J 37/32724 |
| 2022/0415627 A1* | 12/2022 | Nishi | ................ H01J 37/32715 |

FOREIGN PATENT DOCUMENTS

| | | |
|---|---|---|
| JP | 2021158134 A | 10/2021 |
| JP | 2022-524088 A | 4/2022 |
| JP | 2022520784 A | 4/2022 |
| JP | 2022084630 A | 6/2022 |
| WO | 2020167451 A1 | 8/2020 |
| WO | 2020/185395 A1 | 9/2020 |

* cited by examiner

*Primary Examiner* — Danny Nguyen
*Assistant Examiner* — Samantha L Faubert
(74) *Attorney, Agent, or Firm* — XSENSUS LLP

(57) ABSTRACT

A plasma processing apparatus includes a plasma processing chamber and a substrate support disposed in the plasma processing chamber. The substrate support includes a ceramic member having a substrate supporting surface and a back surface, a chuck electrode layer, a bias electrode layer, a gas diffusion channel horizontally extending in the ceramic member and having a main path and branch paths branched from the main path, a gas inlet vertically extending from the back surface to the gas diffusion channel in the ceramic member, and gas outlets communicating with the gas diffusion channel. Each gas outlet has a cavity portion horizontally extending from at least one of the branch paths and a porous portion vertically extending from the cavity portion to the substrate supporting surface and filled with a ceramic porous material.

18 Claims, 8 Drawing Sheets

PLASMA PROCESSING APPARATUS AND ELECTROSTATIC CHUCK

CROSS-REFERENCE TO RELATED APPLICATION

This application claims priority to Japanese Patent Application No. 2022-126266, filed on Aug. 8, 2022, the entire contents of which are incorporated herein by reference.

TECHNICAL FIELD

The present disclosure relates to a plasma processing apparatus and an electrostatic chuck.

BACKGROUND

Japanese Laid-open Patent Publication No. 2022-524088 discloses an electrostatic chuck for use in a substrate processing chamber. The electrostatic chuck includes a plate having a first surface and a second surface facing the first surface, a first electrode embedded in the plate to be close to the first surface, a second electrode embedded in the plate to be close to the second surface, a plurality of conductive elements that connect the first electrode and the second electrode, a first gas channel disposed between the first electrode and the second electrode in the plate, a gas inlet extending from the second surface of the plate to the first gas channel, and a plurality of gas outlets extending from the first surface of the plate to the first gas channel.

U.S. Pat. No. 6,581,275 discloses an electrostatic chuck including a dielectric, an electrode embedded in the dielectric, and a dielectric insert disposed at an outlet of a gas conduit.

SUMMARY

In one aspect, the present disclosure provides a plasma processing apparatus that suppresses abnormal discharge and an electrostatic chuck.

One aspect of the present disclosure provides a plasma processing apparatus comprising a plasma processing chamber; a substrate support disposed in the plasma processing chamber, and the substrate support including: a ceramic member having a substrate supporting surface and a back surface; a chuck electrode layer disposed below the substrate supporting surface in the ceramic member; a bias electrode layer disposed below the chuck electrode layer in the ceramic member; a gas diffusion channel horizontally extending in the ceramic member and below the bias electrode layer, the gas diffusion channel having a main path and a plurality of branch paths branched from the main path; a gas inlet vertically extending from the back surface to the gas diffusion channel in the ceramic member; and a plurality of gas outlets communicating with the gas diffusion channel, each gas outlet having a cavity portion horizontally extending from at least one of the branch paths and a porous portion vertically extending from the cavity portion to the substrate supporting surface and filled with a ceramic porous material; a heat transfer gas supply configured to supply a heat transfer gas to the gas inlet; a DC power supply configured to apply a DC voltage to the chuck electrode layer; and a bias power supply configured to apply a voltage pulse sequence to the bias electrode layer.

DETAILED DESCRIPTION

Figure 1:
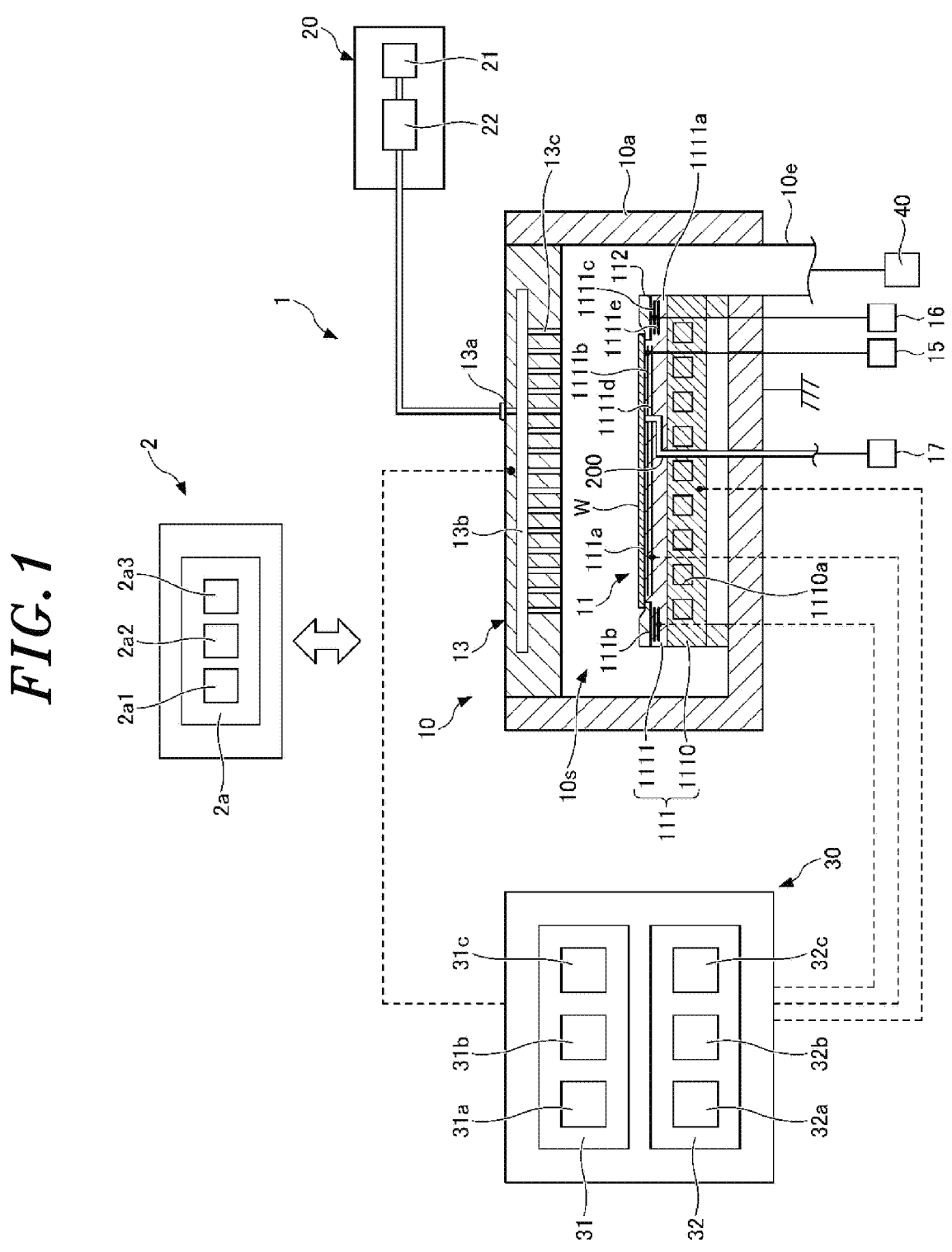
FIG. 1 is an example of a diagram for explaining a configuration example of a capacitively coupled plasma processing apparatus.

Hereinafter, various embodiments will be described in detail with reference to the accompanying drawings. Like reference numerals will be given to like or corresponding parts throughout the drawings.

[Plasma Processing System]

Hereinafter, a configuration example of a plasma processing system will be described. FIG. 1 is an example of a diagram for explaining a configuration example of a capacitively coupled plasma processing apparatus 1.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. The plasma processing apparatus 1 further includes a substrate support 11 and a gas introduction unit. The gas introduction unit is configured to introduce at least one processing gas into the plasma processing chamber 10. The gas introduction unit includes a showerhead 13. The substrate support 11 is disposed in the plasma processing chamber 10. The showerhead 13 is disposed above the substrate support 11. In one embodiment, the showerhead 13 forms at least a part of a ceiling of plasma processing chamber 10. The plasma processing chamber 10 has a plasma processing space 10s defined by the showerhead 13, a sidewall 10a of the plasma processing chamber 10, and the substrate support 11. The plasma processing chamber 10 has at least one gas supply port for supplying at least one processing gas to the plasma processing space 10s and at least one gas exhaust port for exhausting a gas from the plasma processing space 10s. The plasma processing chamber 10 is grounded. The showerhead 13 and the substrate support 11 are electrically insulated from the housing of the plasma processing chamber 10.

The substrate support 11 includes a main body 111 and a ring assembly 112. The main body 111 has a central region 111a for supporting the substrate W and an annular region 111b for supporting the ring assembly 112. A wafer is an example of a substrate W. The annular region 111b of the main body 111 surrounds the central region 111a of the main body 111 in plan view. The substrate W is disposed on the central region 111a of the main body 111, and the ring assembly 112 is disposed on the annular region 111b of the main body 111 to surround the substrate W on the central region 111a of the main body 111. Accordingly, the central region 111a is also referred to as "substrate supporting surface" for supporting the substrate W, and the annular region 111$b$ is also referred to as "ring supporting surface" for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111$a$, a chuck electrode layer 1111$b$ disposed in the ceramic member 1111$a$, an annular chuck electrode layer 1111$c$ disposed in the ceramic member 1111$a$, a bias electrode layer 1111$d$ disposed in the ceramic member 1111$a$, and an annular bias electrode layer 1111$e$ disposed in the ceramic member 1111$a$. The ceramic member 1111$a$ has the central region 111$a$. In one embodiment, the ceramic member 1111$a$ also has the annular region 111$b$.

The chuck electrode layer 1111$b$ is disposed in the central region 111$a$ of the ceramic member 1111$a$. The plasma processing apparatus 1 includes a DC power supply 15 configured to apply a DC voltage to the chuck electrode layer 1111$b$. The chuck electrode layer 1111$b$ is connected to the DC power supply 15. The annular chuck electrode layer 1111$c$ is disposed in the annular region 111$b$ of the ceramic member 1111$a$. The plasma processing apparatus 1 includes a DC power supply 16 configured to apply a DC voltage to the annular chuck electrode layer 1111$c$. The annular chuck electrode layer 1111$c$ is connected to the DC power supply 16. Although an example in which the chuck electrode layer 1111$b$ and the annular chuck electrode layer 1111$c$ are unipolar electrodes is illustrated, they may be bipolar electrodes. Another member surrounding the electrostatic chuck 1111, such as an annular electrostatic chuck or an annular insulating member, may have the annular region 111$b$. In this case, the ring assembly 112 may be disposed on the annular electrostatic chuck or the annular insulating member, or may be placed on both the electrostatic chuck 1111 and the annular insulating member.

The bias electrode layer 1111$d$ is disposed in the central region 111$a$ of the ceramic member 1111$a$, and is disposed below the chuck electrode layer 1111$b$ (to be distant from the substrate supporting surface). The annular bias electrode layer 1111$e$ is disposed in the annular region 111$b$ of the ceramic member 1111$a$, and is disposed below the annular chuck electrode layer 1111$c$ (to be distant from the substrate supporting surface). The bias electrode layer 1111$d$ and the annular bias electrode layer 1111$e$ are connected to a radio frequency (RF) power supply 31 and/or a direct current (DC) power supply 32, respectively, which will be described later. The bias electrode layer 1111$d$ and the annular bias electrode layer 1111$e$ are also referred to as "RF/DC electrodes." In this case, the bias electrode layer 1111$d$ and the annular bias electrode layer 1111$e$ function as lower electrodes. A bias RF signal and/or a DC signal, which will be described later, are supplied to the bias electrode layer 1111$d$ and the annular bias electrode layer 1111$e$. Further, the conductive member of the base 1110, the bias electrode layer 1111$d$, and the annular bias electrode layer 1111$e$ may function as a plurality of lower electrodes. Further, the chuck electrode layer 1111$b$ and the annular chuck electrode layer 1111$c$ may function as the lower electrodes. Accordingly, the substrate support 11 includes at least one lower electrode.

The ring assembly 112 includes one or multiple annular members. In one embodiment, one or multiple annular members include one or more edge rings and at least one cover ring. The edge ring is made of a conductive material or an insulating material, and the cover ring is made of an insulating material.

Further, the substrate support 11 may include a temperature control module configured to adjust at least one of the electrostatic chuck 1111, the ring assembly 112, and the substrate W to a target temperature. The temperature control module may include a heater, a heat transfer medium, a channel 1110$a$, or a combination thereof. A heat transfer fluid, such as brine or gas, flows through the channel 1110$a$. In one embodiment, the channel 1110$a$ is formed in the base 1110 and one or more heaters are disposed in the ceramic member 1111$a$ of the electrostatic chuck 1111. Further, the substrate support 11 may include a heat transfer gas supply 17 configured to supply a heat transfer gas to the gap between the backside of the substrate W and the central region 111$a$. The heat transfer gas supply 17 is configured to supply a heat transfer gas (for example, He gas) to a communication path 200 formed in the electrostatic chuck 1111.

The showerhead 13 is configured to introduce at least one processing gas from the gas supply 20 into the plasma processing space 10$s$. The showerhead 13 has at least one gas supply port 13$a$, at least one gas diffusion space 13$b$, and multiple gas inlet ports 13$c$. The processing gas supplied to the gas supply port 13$a$ passes through the gas diffusion space 13$b$ and is introduced into the plasma processing space 10$s$ through the gas inlet ports 13$c$. The showerhead 13 includes at least one upper electrode. The gas introduction unit may include, in addition to the showerhead 13, one or more side gas injectors (SGI) attached to one or more openings formed in the sidewall 10$a$.

The gas supply 20 may include at least one gas source 21 and at least one flow rate controller 22. In one embodiment, the gas supply 20 is configured to supply at least one processing gas from the corresponding gas source 21 to the showerhead 13 through the corresponding flow rate controller 22. The flow rate controllers 22 may include, for example, a mass flow controller or a pressure-controlled flow rate controller. Further, the gas supply 20 may include one or more flow modulation devices for modulating the flow rate of at least one processing gas or causing it to pulsate.

The power supply 30 includes an RF power supply 31 connected to the plasma processing chamber 10 through at least one impedance matching circuit. The RF power supply 31 is configured to supply at least one RF signal (RF power) to at least one lower electrode and/or at least one upper electrode. Accordingly, plasma is produced from at least one processing gas supplied to the plasma processing space 10$s$. Therefore, the RF power supply 31 may function as at least a part of a plasma generator configured to generate plasma from one or more processing gases in plasma processing chamber 10. Further, by supplying the bias RF signal to at least one lower electrode, a bias potential is generated at the substrate W, and ions in the produced plasma can be attracted to the substrate W.

In one embodiment, the RF power supply 31 includes a first RF generator 31$a$, a second RF generator 31$b$, and an RF generator (bias power supply) 31$c$. The first RF generator 31$a$ is connected to at least one lower electrode and/or at least one upper electrode through at least one impedance matching circuit to generate a source RF signal (source RF power) for plasma generation. In one embodiment, the source RF signal has a frequency within a range of 10 MHz to 150 MHz. In one embodiment, the first RF generator 31$a$ may be configured to generate multiple source RF signals having different frequencies. The generated single or multiple RF signals are supplied to at least one lower electrode and/or at least one upper electrode. The RF generator $31c$ is configured to generate an RF signal (sequence of RF pulse signals).

The second RF generator $31b$ is connected to the at least one lower electrode through at least one impedance matching circuit, and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within a range of 100 kHz to 60 MHz. In one embodiment, the second RF generator $31b$ may be configured to generate multiple bias RF signals having different frequencies. The generated single or multiple bias RF signals are supplied to at least one lower electrode. Further, in various embodiments, at least one of the source RF signal and the bias RF signal may pulsate.

The power supply 30 may include the DC power supply 32 connected to the plasma processing chamber 10. The DC power supply 32 includes a first DC generator $32a$, a second DC generator $32b$, and a DC generator (bias power supply) $32c$. In one embodiment, the first DC generator $32a$ is connected to at least one lower electrode, and is configured to generate a first DC signal. The generated first bias DC signal is applied to at least one lower electrode. In one embodiment, the second DC generator $32b$ is connected to the at least one upper electrode, and is configured to generate a second DC signal. The generated second DC signal is applied to at least one upper electrode. The DC generator $32c$ is configured to generate a DC signal (sequence of DC pulse signals).

In various embodiments, at least one of the first and second DC signals may pulsate. In this case, a sequence of voltage pulses is applied to at least one lower electrode and/or at least one upper electrode. The voltage pulses may have a rectangular pulse waveform, a trapezoidal pulse waveform, a triangular pulse waveform, or a combination thereof. In one embodiment, a waveform generator for generating a sequence of voltage pulses from the DC signal is connected between the first DC generator $32a$ and at least one lower electrode. Therefore, the first DC generator $32a$ and the waveform generator constitute a voltage pulse generator. When the second DC generator $32b$ and the waveform generator constitute the voltage pulse generator, the voltage pulse generator is connected to at least one upper electrode. The voltage pulse may have positive polarity or negative polarity. Further, the sequence of voltage pulses may include one or more positive voltage pulses and one or more negative voltage pulses in one cycle. The first DC generator $32a$ and the second DC generator $32b$ may be provided in addition to the RF power supply 31, and the first DC generator $32a$ may be provided instead of the second RF generator $31b$.

The exhaust system 40 may be connected to a gas outlet $10e$ disposed at a bottom portion of the plasma processing chamber 10, for example. The exhaust system 40 may include a pressure control valve and a vacuum pump. The pressure control valve adjusts a pressure in the plasma processing space $10s$. The vacuum pump may include a turbo molecular pump, a dry pump, or a combination thereof.

The controller 2 processes computer-executable instructions that cause the plasma processing apparatus 1 to perform various steps described herein. The controller 2 may be configured to control individual components of the plasma processing apparatus 1 to perform various steps described herein. In one embodiment, the controller 2 may be partially or entirely included in the plasma processing apparatus 1. The controller 2 may include a processor $2a1$, a storage part $2a2$, and a communication interface $2a3$. The controller 2 is realized by, for example, a computer $2a$. The processor $2a1$ may be configured to perform various control operations by reading a program from the storage part $2a2$ and executing the read program. This program may be stored in the storage part $2a2$ in advance, or may be acquired through a medium when necessary. The acquired program is stored in the storage unit $2a2$, and read from the storage unit $2a2$ and executed by the processor $2a1$. The medium may be various storage media readable by the computer $2a$, or a communication line connected to the communication interface $2a3$. The processor $2a1$ may be a central processing unit (CPU). The storage part $2a2$ may include a random access memory (RAM), a read only memory (ROM), a hard disk drive (HDD), a solid state drive (SSD), or a combination thereof. The communication interface $2a3$ may communicate with the plasma processing apparatus 1 through a communication line such as a local area network (LAN) or the like.

Hereinafter, the pulsed RF signal supplied to the upper electrode or the lower electrode will be referred to as "RF signal." The pulsed DC signal applied to the lower electrode will be referred to as "DC signal." In the following description, the pulsed RF signal is supplied to the lower electrode. However, the present disclosure is not limited thereto, and the pulsed RF signal may be supplied to the upper electrode.

[RF Signal/DC Signal]

Figure 2:
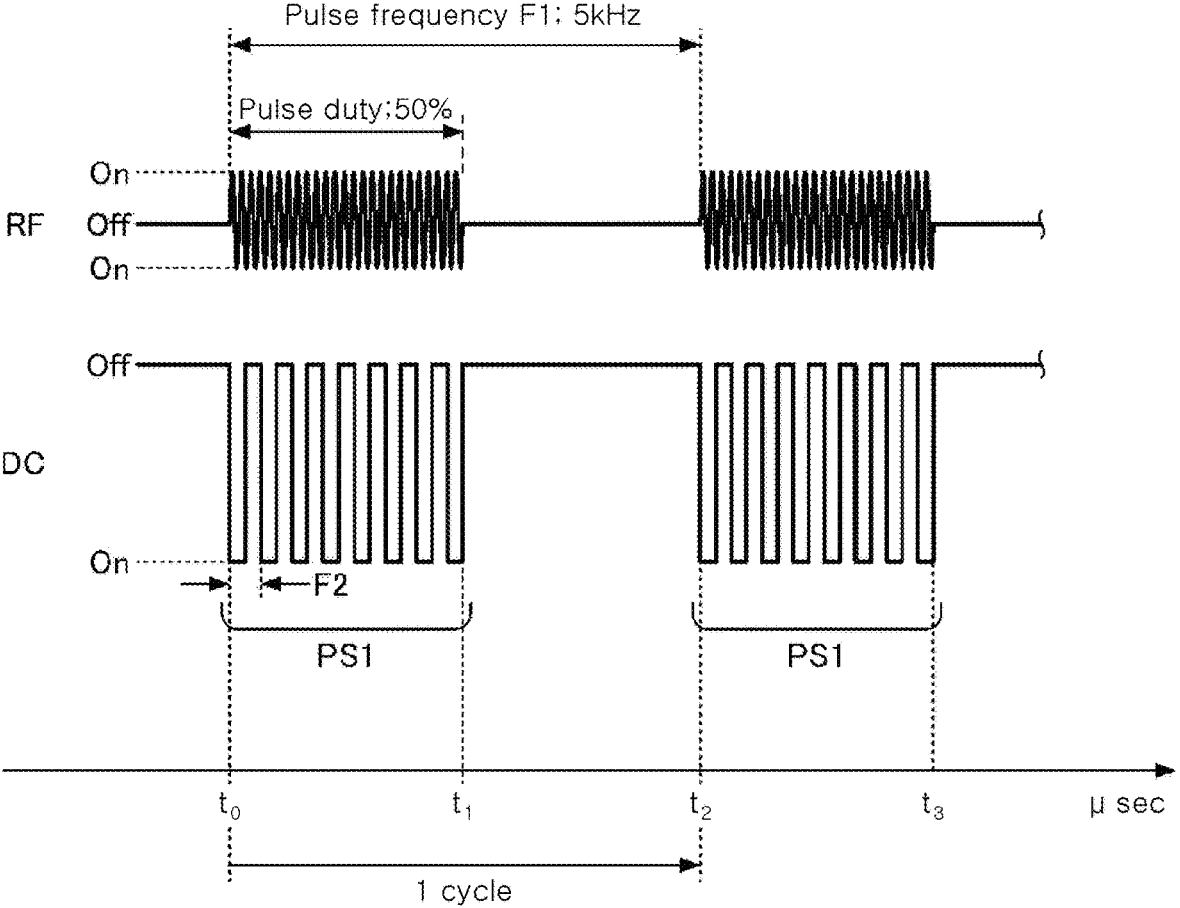
FIG. 2 is a diagram for explaining an RF pulse signal and a DC pulse signal.

FIG. 2 is a diagram for explaining an RF signal and a DC signal. In the following drawings, the RF signal will be abbreviated as "RF" and the DC signal will be abbreviated as "DC." In the following description, a pulsed source REF signal will be described as an example of the RF signal. A source RF signal is an RF signal for plasma generation. In FIG. 2, the horizontal axis indicates time, the RF vertical axis indicates a power level, and the DC vertical axis indicates a voltage level.

In one embodiment, the RF signal and the DC signal are in an on state from time $t_0$ to time $t_1$ and in an off state from time $t_1$ to time $t_2$. The on state and the off state is repeated as one cycle. In the RF signal and the DC signal, a pulse frequency F1 is within a range 1 kHz to 50 kHz. In the illustrated example, the on state and the off state of the DC signal are synchronized with those of the RF signal. However, the present disclosure is not limited thereto. For example, the on state of the DC signal may be offset with respect to the on state of the RF signal, and the duration of the on state of the DC signal may be different from that of the on state of the RF signal.

In one embodiment, the RF signal has a frequency within a range of 100 kHz to 150 MHz during the on state, and has a zero power level during the off state. The DC signal has a voltage pulse sequence PS1 during the on state. The voltage pulse sequence PS1 repeats an on state (negative voltage level) and an off state (zero voltage level) in a second pulse period (pulse frequency F2). In other words, the voltage pulse sequence PS1 has the pulse frequency F2 higher than the pulse frequency F1. In one embodiment, the pulse frequency F2 is within a range of 100 kHz to 1 MHz. In one embodiment, the pulse frequency F2 is within a range of 300 kHz to 600 kHz.

The DC signal has the voltage pulse sequence PS1 having a first voltage level during an off state and a second voltage level during an on state. The absolute value of the second voltage level is greater than that of the first voltage level. In one embodiment, the first voltage level has a zero voltage level, the second voltage level has negative polarity. The voltage pulse sequence PS1 repeats the zero voltage level and the negative voltage level at the pulse frequency F2.

In this manner, the RF generator 31c and/or the DC generator 32c as the bias power supply apply the voltage pulse sequence (for example, the RF pulse signal and/or the DC pulse signal shown in FIG. 2) to the bias electrode layer 1111d and the annular bias electrode layer 1111e serving as the lower electrodes.

[Electrostatic Chuck 1111]

Figure 3:
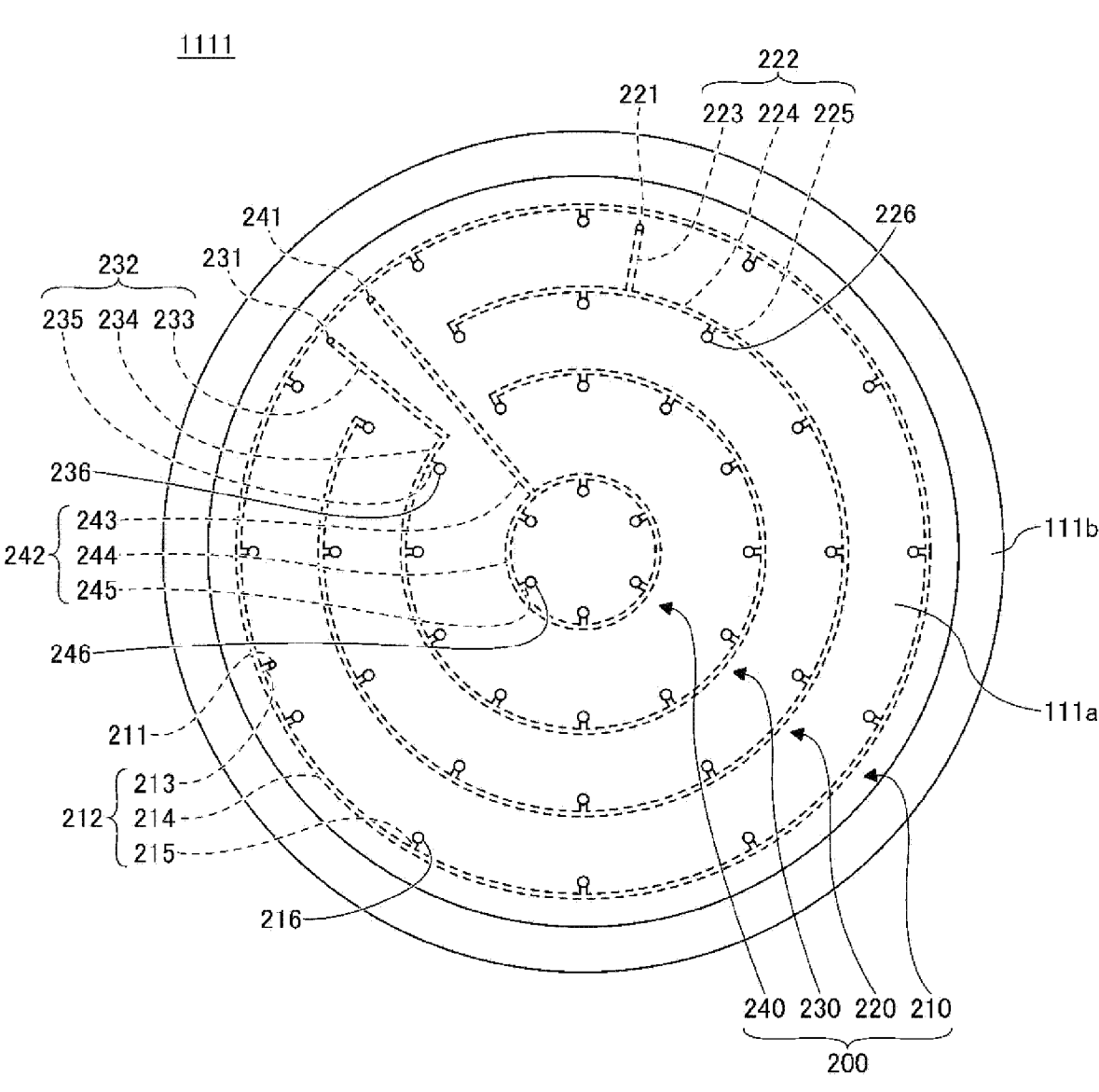
FIG. 3 is an example of a top view of an electrostatic chuck.
Figure 4:
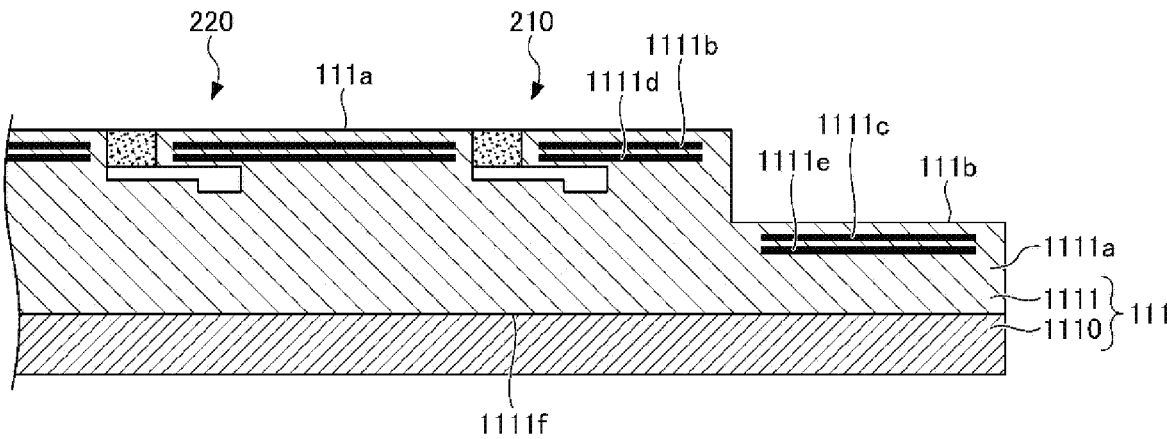
FIG. 4 is an example of a cross-sectional view of a main body of a substrate support.
Figure 5A:
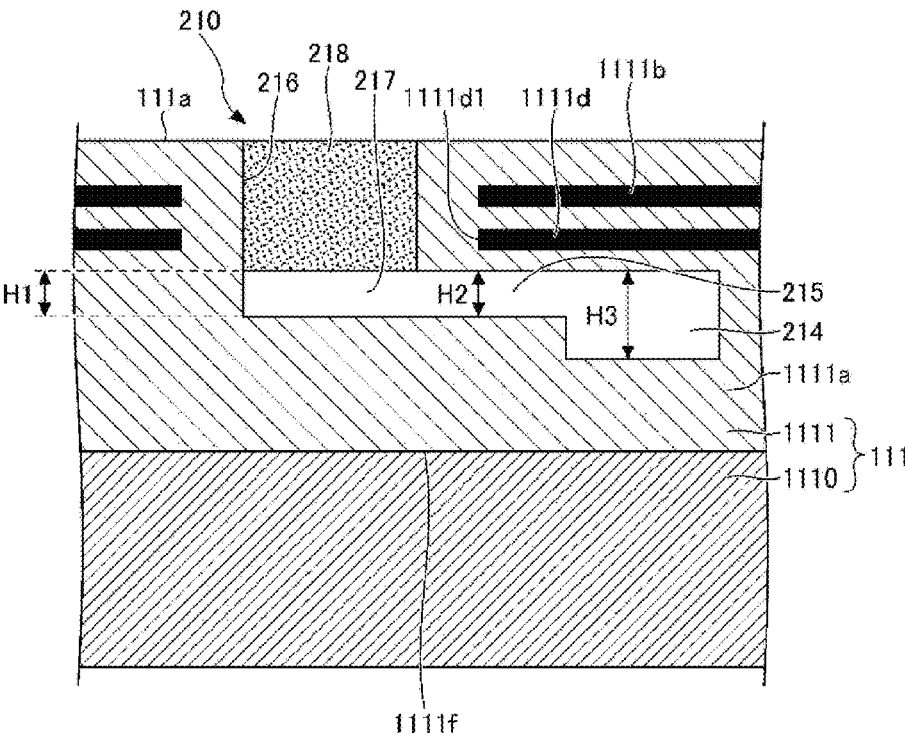
FIGS. 5A and 5B are examples of a partially enlarged cross-sectional view of the main body of the substrate support.
Figure 5B:
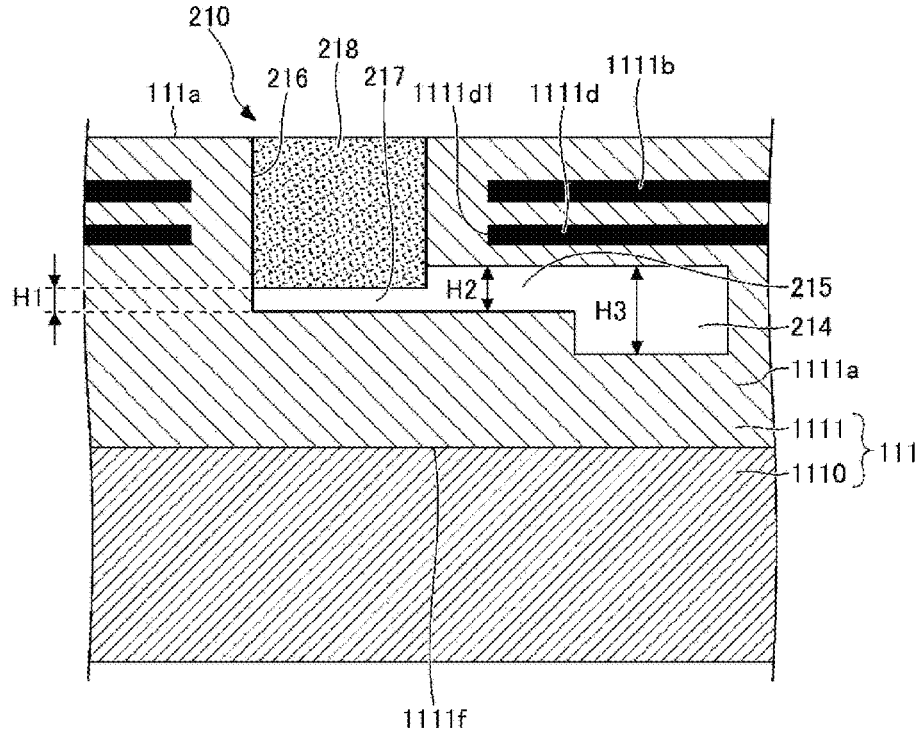

Next, the electrostatic chuck 1111 will be described further. FIG. 3 is an example of a top view of the electrostatic chuck 1111. FIG. 4 is an example of a cross-sectional view of the main body 111 of the substrate support 11. FIGS. 5A and 5B are examples of a partially enlarged cross-sectional view of the main body 111 of the substrate support 11.

As shown in FIG. 4, the ceramic member 1111a of the electrostatic chuck 1111 has the substrate supporting surface (the central region 111a) for supporting the substrate W and the ring supporting surface (the annular region 111b) for supporting the ring assembly 112. Further, the ceramic member 1111a has a back surface 1111f that is a surface (lower surface in FIG. 4) opposite to the substrate supporting surface and the ring supporting surface. The chuck electrode layer 1111b is disposed below the substrate supporting surface in the central region 111a of the ceramic member 1111a. The bias electrode layer 1111d is disposed below the chuck electrode layer 1111b in the central region 111a of the ceramic member 1111a. The annular chuck electrode layer 1111c is disposed below the ring supporting surface in the annular region 111b of the ceramic member 1111a. The annular bias electrode layer 1111e is disposed below the annular chuck electrode layer 1111c in the annular region 111b of the ceramic member 1111a.

Further, the ceramic member 1111a of the electrostatic chuck 1111 has the communication path 200 through which the heat transfer gas supplied from the heat transfer gas supply 17 (see FIG. 1) flows. The communication path 200 has communication paths 210, 220, 230, and 240, for example.

The communication path 210 has a gas inlet 211, a gas diffusion channel 212, and a plurality of gas outlets 216. The gas diffusion channel 212 has an inlet portion 213, an annular portion 214, and a plurality of branch portions 215.

The gas inlet 211 is formed in the ceramic member 1111a, and extends in a longitudinal direction from the back surface 1111f of the ceramic member 1111a to the gas diffusion channel 212. Further, the heat transfer gas supply 17 (see FIG. 1) is configured to supply the heat transfer gas to the gas inlet 211 formed on the back surface 1111f of the ceramic member 1111a.

The gas diffusion channel 212 is disposed below the bias electrode layer 1111d in the ceramic member 1111a. Further, the gas diffusion channel 212 extends in a horizontal direction. The inlet portion 213 has one end communicating with the gas inlet 211 and the other end communicating with the annular portion 214. The annular portion 214 is formed in a substantially annular shape concentric with the center of the electrostatic chuck 1111. The inlet portion 213 and the annular portion 214 are also referred to as "main path (main portion)" of the gas diffusion channel 212. The branch portions 215 are branched from the annular portion 214. Each of the branch portions 215 has one end communicating with the annular portion 214 (main path) and the other end communicating with the gas outlet 216. The branch portion 215 is also referred to as "branch path." Therefore, the gas diffusion channel 212 has the main path and multiple branch paths branched from the main path.

The gas outlet 216 has one end communicating with the gas diffusion channel 212 and the other end communicating with the space (the space between the substrate supporting surface and the backside of the substrate W supported on the substrate supporting surface) facing the substrate supporting surface. The gas outlet 216 has a cavity portion 217 and a porous portion 218. The cavity portion 217 extends in the horizontal direction from at least one of the branch portions 215. The porous portion 218 extends in the longitudinal direction from the cavity portion 217 to the substrate supporting surface (the central region 111a), and is filled with a ceramic porous material. Further, the porous portion 218 extends in the longitudinal direction from a position lower than the bottom surface of the bias electrode layer 1111d to the substrate supporting surface (the central region 111a). The porous portion 218 is formed to allow the heat transfer gas to flow from the cavity portion 217 to the space facing the substrate supporting surface. The porous portion 218 reduces a distance in a voltage application direction (longitudinal direction, vertical direction) of the space in the porous portion 218 through which the heat transfer gas can flow. Accordingly, abnormal discharge of the heat transfer gas is suppressed as will be described later.

The porous portion 218 is formed by providing a material obtained by mixing a ceramic material and a resin material in a hole serving as the gas outlet 216 formed in the ceramic member 1111a before sintering, and then sintering the ceramic member 1111a, for example. Further, the electrostatic chuck 1111 may be formed by stacking a thin plate-shaped ceramic material forming the ceramic member 1111a, a conductive material forming the electrode layers (the chuck electrode layer 1111b, the annular chuck electrode layer 1111c, the bias electrode layer 1111d, and the annular bias electrode layer 1111e), a material forming the porous portion 218 in which a resin material and a ceramic material are mixed, and then sintering them, for example.

Figure 6:
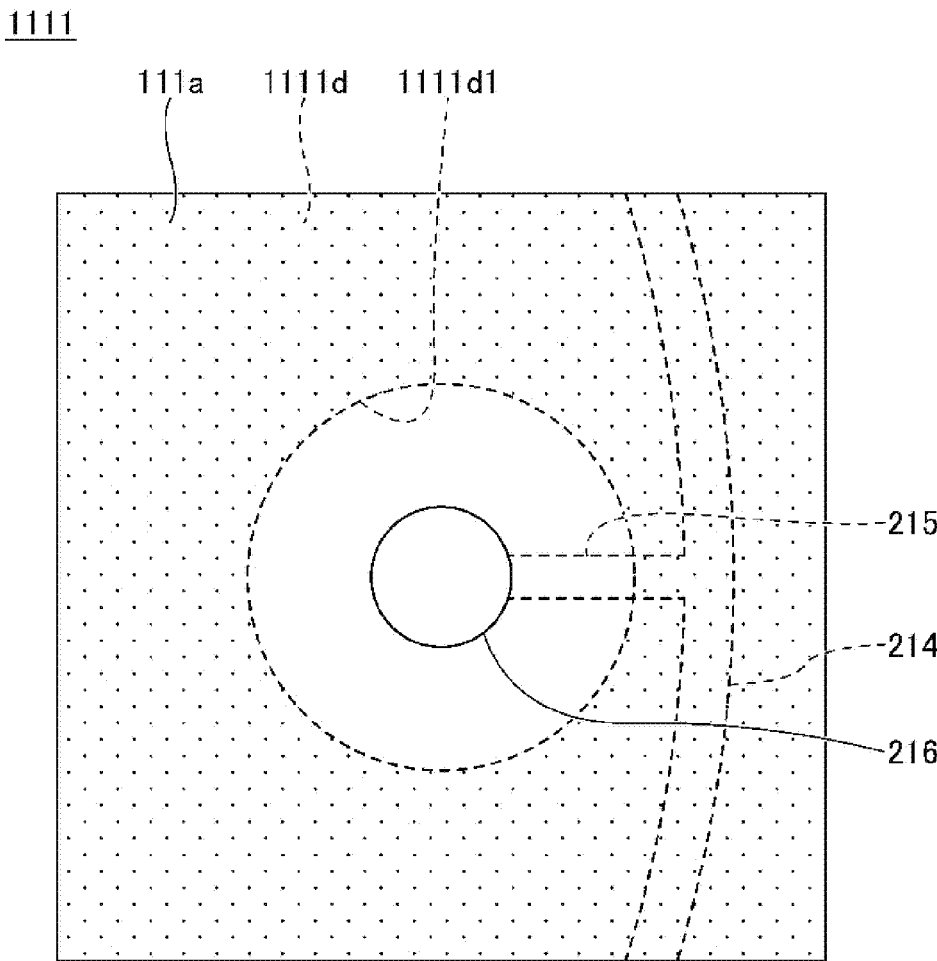
FIG. 6 is an example of a top view of the electrostatic chuck in which the vicinity of a gas outlet is enlarged.

FIG. 6 is an example of a top view of the electrostatic chuck 1111 in which the vicinity of the gas outlet 216 is enlarged. In FIG. 6, the position where the bias electrode layer 1111d is disposed is indicated by dot patterns.

The bias electrode layer 1111d disposed in the ceramic member 1111a is formed in a substantially disc shape. An opening 1111d1 is formed in the bias electrode layer 1111d to avoid the position where the gas outlet 216 is formed.

The inlet portion 213 and the annular portion 214, which are the main path of the gas diffusion channel 212, are disposed below the bias electrode layer 1111d in plan view. Here, when the voltage pulse sequence is applied to the base 1110 and the bias electrode layer 1111d functioning as the lower electrodes, the base 1110 and the bias electrode layer 1111d have the same potential. In other words, the base 1110 disposed below the main path (the inlet portion 213 and the annular portion 214) and the bias electrode layer 1111d disposed above the main path (the inlet portion 213 and the annular portion 214) have the same potential, so that the potential difference in the vertical potential is not generated in the main path (the inlet portion 213 and the annular portion 214). In other words, abnormal discharge in the inlet portion 213 and the annular portion 214 can be suppressed.

On the other hand, the gas outlet 216 is disposed to penetrate through the opening 1111d1 of the bias electrode layer 1111d. Therefore, the potential difference is generated in the vertical direction between the substrate W supported on the substrate supporting surface and the base 1110 functioning as the lower electrode. Due to the potential difference, abnormal discharge may occur in the gas outlet 216 when the substrate W is subjected to plasma processing.

Since the gas outlet 216 has the porous portion 218, it is possible to shorten the mean free path of ionized electrons in the vertical direction while ensuring the flow of the heat transfer gas. Accordingly, abnormal discharge in the gas outlet 216 can be suppressed.

Further, the gas outlet 216 has the cavity portion 217 below the porous portion 218. Hence, the heat transfer gas supplied from the heat transfer gas supply 17 to the gas inlet 211 flows into the cavity portion 217 through the inlet portion 213, the annular portion 214, and the branch portions 215. The heat transfer gas flows into the porous portion 218 from the bottom surface side of the porous portion 218 facing the cavity portion 217, and flows into the space (the space between the substrate supporting surface and the backside of the substrate W supported on the substrate supporting surface) facing the substrate supporting surface. Accordingly, the conductance of the communication path 210 can be increased.

A longitudinal dimension H1 of the cavity portion 217 and a longitudinal dimension H2 of the branch portion 215 are smaller than 180 μm. Accordingly, abnormal discharge in the cavity portion 217 can be suppressed. The longitudinal dimension is also referred to as "height dimension" and "voltage gradient direction between the substrate W and the base 1110."

In one embodiment, the longitudinal dimension H1 of the cavity portion 217 and the longitudinal dimension H2 of the branch portion 215 are greater than or equal to 50 μm. Accordingly, the conductance of the communication path 210 can be increased.

In one embodiment, the longitudinal dimension H1 of the cavity portion 217 is the same as the longitudinal dimension H2 of the branch portion 215, as shown in FIG. 5A.

Further, the longitudinal dimension H1 of the cavity portion 217 may be different from the longitudinal dimension H2 of the branch portion 215. In one embodiment, the longitudinal dimension H1 of the cavity portion 217 is smaller than the longitudinal dimension H2 of the branch portion 215, as shown in FIG. 5B.

The longitudinal dimension H2 of the branch portion 215 is smaller than a longitudinal dimension H3 of the annular portion 214 that is the main path. Hence, the cross-sectional area of the main path can be increased, and the conductance of the communication path 210 can be increased.

Further, in accordance with the plasma processing apparatus 1, it is possible to increase the pressure of the heat transfer gas while suppressing abnormal discharge of the heat transfer gas in the communication path 210. Accordingly, heat transfer between the substrate W and the main body 111 is improved. Therefore, even if the heat input from plasma to the substrate W is increased by increasing the bias voltage, the substrate W can be cooled appropriately. Further, when the plasma processing apparatus 1 is a plasma etching apparatus, the verticality and productivity of etching are improved by increasing the bias voltage.

Similarly, as shown in FIG. 3, the communication path 220 has a gas inlet 221, a gas diffusion channel 222, and a plurality of gas outlets 226. The gas diffusion channel 222 has an inlet portion 223, an annular portion 224, and a plurality of branch portions 225. The communication path 230 has a gas inlet 231, a gas diffusion channel 232, and a plurality of gas outlets 236. The gas diffusion channel 232 has an inlet portion 233, an annular portion 234, and a plurality of branch portions 235. The communication path 240 has a gas inlet 241, a gas diffusion channel 242, and a plurality of gas outlets 246. The gas diffusion channel 242 has an inlet portion 243, an annular portion 244, and a plurality of branch portions 245. Since the communication paths 220, 230, and 240 are the same as the communication path 210, redundant description thereof will be omitted.

The communication path 200 does not necessarily have the configuration shown in FIGS. 2 and 3. For example, a single gas inlet may be formed at the back surface 1111f of the ceramic member 1111a and branched to supply the heat transfer gas to the gas diffusion channels 212, 222, 232, and 242. Further, the electrostatic chuck 1111 may have a configuration in which one main path is formed in a spiral shape, for example, and branched from the main path to multiple branch paths communicating with the respective gas outlets.

Although the case where the cavity portion 217 of the gas outlet 216 extends in the horizontal direction from one branch portion 215 has been described, the present disclosure is not limited thereto.

Figure 7:
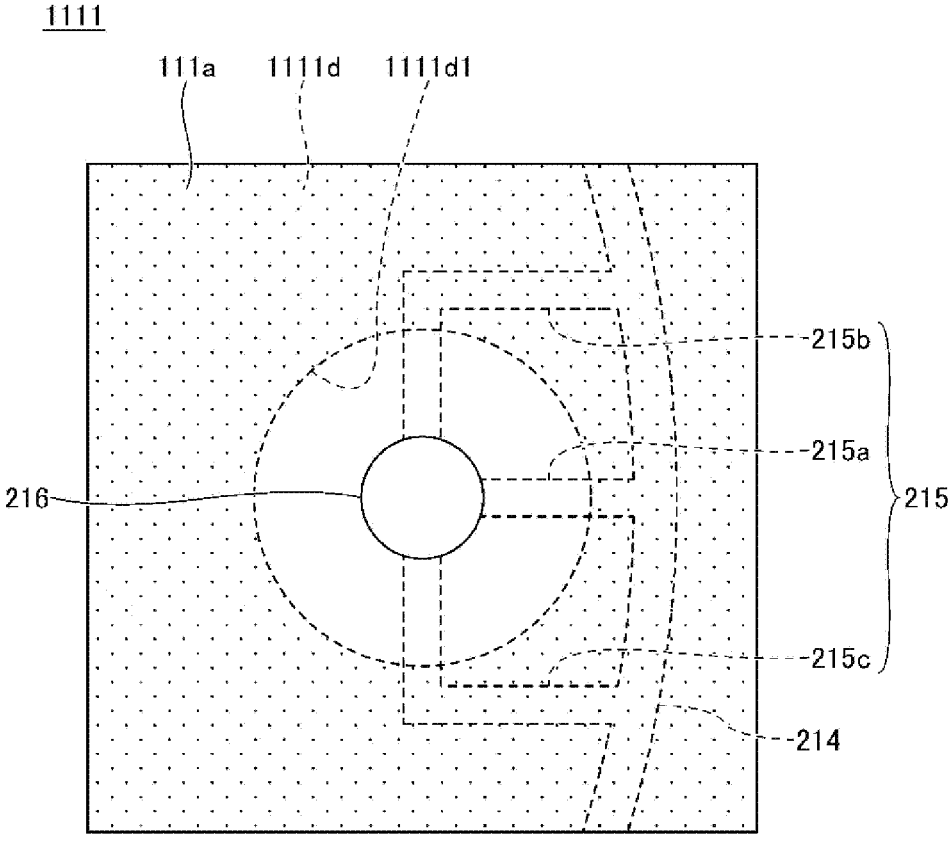
FIG. 7 is another example of the top view of the electrostatic chuck in which the vicinity of the gas outlet is enlarged.

The cavity portion 217 of the gas outlet 216 may extend in the horizontal direction from at least two branch paths. FIG. 7 is another example of the top view of the electrostatic chuck 1111 in which the vicinity of the gas outlet 216 is enlarged. The gas outlet 216 extends in the horizontal direction from three branch portions 215a, 215b, and 215c to form the cavity portion 217 (see FIG. 5). Accordingly, the conductance of the branch portion 215 can be increased.

Figure 8:
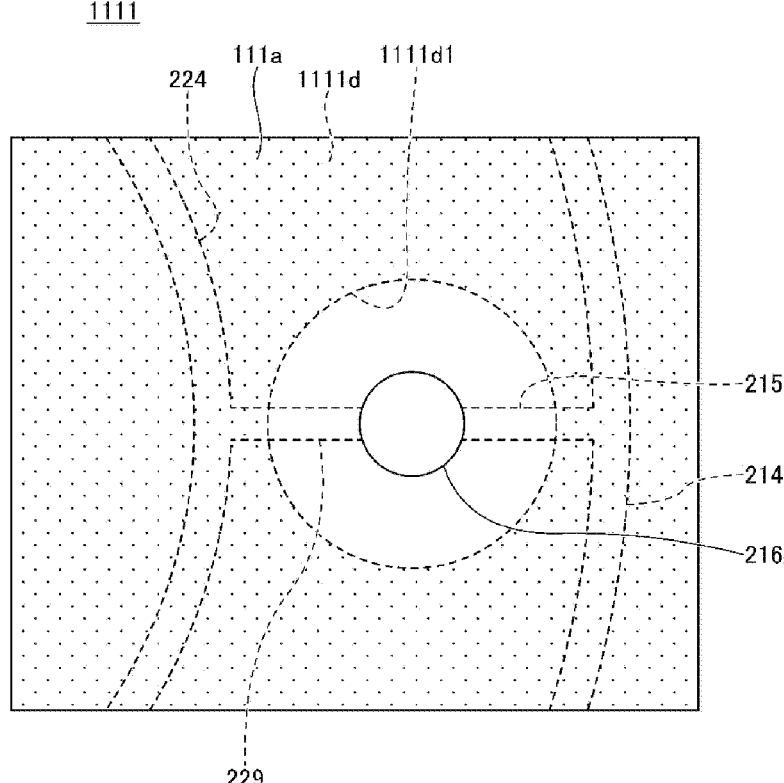
FIG. 8 is still another example of the top view of the electrostatic chuck in which the vicinity of the gas outlet is enlarged.

FIG. 8 is still another example of the top view of the electrostatic chuck 1111 in which the vicinity of the gas outlet 216 is enlarged. The cavity portion 217 (see FIGS. 5A and 5B) is formed to extend from the branch portion 215 (branch path) communicating with the annular portion 214 (main path) of one gas diffusion channel 212 and a branch portion 229 (another main path) communicating with the annular portion 224 (another main path) of another gas diffusion channel 222 extend in the horizontal direction from another branch path). Accordingly, the conductance of the communication path 200 can be increased.

Figure 9:
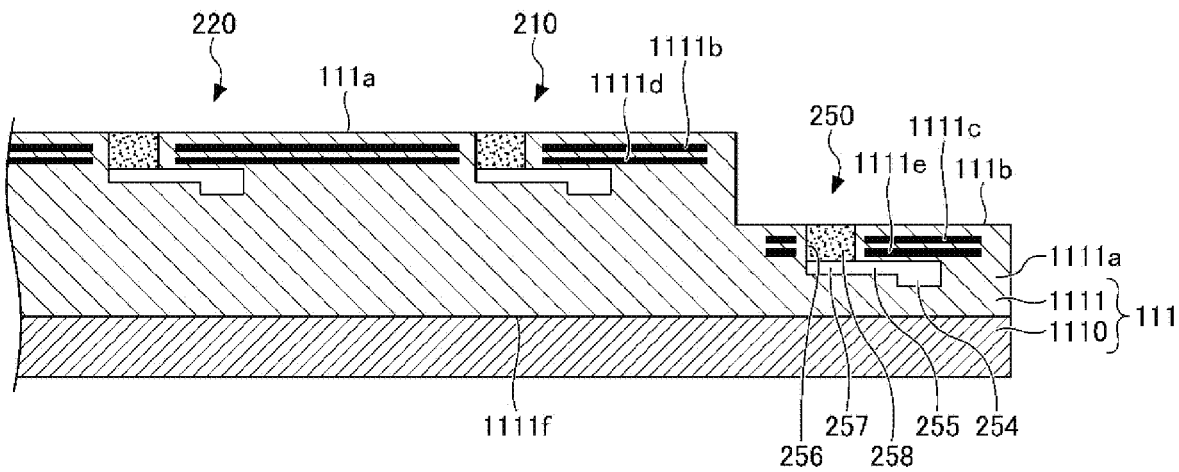
FIG. 9 is another example of a cross-sectional view of the main body of the substrate support.

FIG. 9 is another example of a cross-sectional view of the main body 111 of the substrate support 11. The communication path 200 for a heat transfer gas may be provided in the ring supporting surface. A communication path 250 has a second gas inlet (not shown), a second gas diffusion channel, and a plurality of second gas outlets 256. The second gas diffusion channel has a second inlet portion (second main path), a second annular portion (second main path) 254, and a plurality of second branch portions (second branch paths) 255. The second gas outlet 256 has a second cavity portion 257 and a second porous portion 258.

The second gas inlet (not shown) of the communication path 250 is formed in the ceramic member 1111a to extend in the longitudinal direction from the back surface 1111f of the ceramic member 1111a to the second gas diffusion channel. Further, the heat transfer gas supply 17 (see FIG. 1) is configured to supply a heat transfer gas to the second gas inlet formed at the back surface 1111f of the ceramic member 1111a.

The second gas diffusion channel is disposed below the annular bias electrode layer 1111e in the ceramic member 1111a. Further, the second gas diffusion channel is formed to extend in the horizontal direction. The second inlet portion has one end communicating with the second gas inlet and the other end communicating with the second annular portion 254. The second annular portion 254 is formed in a substantially annular shape concentrical with the center of the electrostatic chuck 1111. The second inlet portion and the second annular portion 254 are also referred to as "second main path (second main portion)" of the second gas diffusion channel. The second branch portions 255 are branched from the second annular portion 254. Each of the second branch portions 255 has one end communicating with the second annular portion 254 (second main path) and the other end communicating with the second gas outlet 256. The second branch portions 255 are also referred to as "second branch paths." In this manner, the second gas diffusion channel has the second main path and the second branch paths branched from the second main path.

The second gas outlet 256 has one end communicating with the second gas diffusion channel and the other end communicating with the space (space between the ring supporting surface and the back surface of the edge ring supported on the ring supporting surface) facing the ring supporting surface. The second gas outlet 256 has the second cavity portion 257 and the second porous portion 258. The second cavity portion 257 extends in the horizontal direction from at least one of the second branch portions 255. The second porous portion 258 extends in the longitudinal direction from the second cavity portion 257 to the ring supporting surface (the annular region 111*b*), and is filled with a ceramic porous material. Further, the second porous portion 258 extends in the longitudinal direction from a position lower than the bottom surface of the annular bias electrode layer 1111*e* to the ring supporting surface (the annular region 111*b*). The second porous portion 258 is formed to allow the heat transfer gas to flow from the second cavity portion 257 to the space facing the ring supporting surface. Further, the second porous portion 258 reduces distance in the voltage application direction (longitudinal direction, vertical direction) of the space in the second porous portion 258 through which the heat transfer gas can flow. Accordingly, abnormal discharge of the heat transfer gas is suppressed as will be described later.

The second gas outlet 256 has the second cavity portion 257 disposed below the second porous portion 258. Hence, the heat transfer gas supplied from the heat transfer gas supply 17 to the second gas inlet flows into the cavity portion 257 through the second inlet portion, the second annular portion 254, and the second branch portions 255. The heat transfer gas flows into the second porous portion 258 from the bottom surface side of the second porous portion 258 facing the second cavity portion 257, and flows into the space (space between the ring supporting surface and the back surface of the edge ring supported on the ring supporting surface) facing the ring supporting surface. Accordingly, the conductance of the communication path 250 can be increased.

The longitudinal dimension of the second cavity portion 257 and that of the second branch portion 255 are less than 180 μm. Thus, abnormal discharge in the second cavity portion 257 can be suppressed.

In one embodiment, the longitudinal dimension of the second cavity portion 257 and that of the second branch portion 255 are greater than or equal to 50 μm. Accordingly, the conductance of the communication path 250 can be increased.

In one embodiment, the longitudinal dimension of the second cavity portion 257 is the same as that of the second branch portion 255.

The longitudinal dimension of the second cavity portion 257 may be different from that of the second branch portion 255. In one embodiment, the longitudinal dimension of the second cavity portion 257 is smaller than that of the second branch portion 255.

Further, the longitudinal dimension of the second branch portion 255 is smaller than that of the second annular portion 254 that is the second main path. Accordingly, the cross-sectional area of the second main path can be increased, which makes it possible to increase the conductance of the communication path 250.

The above-described embodiments include, for example, the following aspects.

(Appendix 1)

A plasma processing apparatus comprising:

a plasma processing chamber;

a substrate support disposed in the plasma processing chamber, and the substrate support including:

a ceramic member having a substrate supporting surface and a back surface;

a chuck electrode layer disposed below the substrate supporting surface in the ceramic member;

a bias electrode layer disposed below the chuck electrode layer in the ceramic member;

a gas diffusion channel extending in a horizontal direction in the ceramic member and below the bias electrode layer, the gas diffusion channel having a main path and a plurality of branch paths branched from the main path;

a gas inlet extending in a longitudinal direction from the back surface to the gas diffusion channel in the ceramic member; and a plurality of gas outlets communicating with the gas diffusion channel, each gas outlet having a cavity portion extending in the horizontal direction from at least one of the branch paths and a porous portion extending in the longitudinal direction from the cavity portion to the substrate supporting surface and filled with a ceramic porous material;

a heat transfer gas supply configured to supply a heat transfer gas to the gas inlet;

a DC power supply configured to apply a DC voltage to the chuck electrode layer; and a bias power supply configured to apply a voltage pulse sequence to the bias electrode layer.

(Appendix 2)

The plasma processing apparatus of appendix 1, wherein the cavity portion has a longitudinal dimension of less than 180 μm.

(Appendix 3)

The plasma processing apparatus of appendix 1 or 2, wherein the cavity portion has a longitudinal dimension that is the same as a longitudinal dimension of a corresponding branch path.

(Appendix 4)

The plasma processing apparatus of any one of appendices 1 to 3, wherein the branch path has a longitudinal dimension smaller than a longitudinal dimension of the main path.

(Appendix 5)

The plasma processing apparatus of any one of appendices 1 to 4, wherein the porous portion extends from a position below the bias electrode layer to the substrate supporting surface.

(Appendix 6)

The plasma processing apparatus of any one of appendices 1 to 5, wherein the cavity portion extends in the horizontal direction from at least two of the branch paths.

(Appendix 7)

The plasma processing apparatus of any one of appendices 1 to 5, wherein the substrate support further includes additional gas diffusion channel extending in the horizontal direction in the ceramic member and below the bias electrode layer, the additional gas diffusion channel has additional main path and a plurality of additional branch paths branched from the additional main path, and the cavity portion extends in the horizontal direction from at least one of the additional branch paths.

(Appendix 8)

The plasma processing apparatus of any one of appendices 1 to 5, wherein the ceramic member further includes a ring supporting surface, and the substrate support includes:

at least one edge ring disposed on the ring supporting surface to surround a substrate on the substrate supporting surface;

at least one annular chuck electrode layer disposed below the ring supporting surface in the ceramic member; and an annular bias electrode layer disposed below said at least one annular chuck electrode layer in the ceramic member.

(Appendix 9)

The plasma processing apparatus of appendix 8, wherein the substrate support includes:

a second gas diffusion channel extending in the horizontal direction in the ceramic member and below the annular bias electrode layer, the second gas diffusion channel having a second main path and a plurality of second branch paths branched from the second main path; and a plurality of second gas outlets communicating with the second gas diffusion channel, each second gas outlet having a second cavity portion extending in the horizontal direction from at least one of the second branch paths and a plurality of second gas outlets extending in the longitudinal direction from the second cavity portion to the ring supporting surface and filled with a ceramic porous material.

(Appendix 10)

The plasma processing apparatus of appendix 9, wherein the second cavity portion has a longitudinal dimension of less than 180 μm.

(Appendix 11)

An electrostatic chuck for use in a plasma processing apparatus, comprising:

a ceramic member having a substrate supporting surface and a back surface;

a chuck electrode layer disposed below the substrate supporting surface in the ceramic member;

a bias electrode layer disposed below the chuck electrode layer in the ceramic member;

a gas diffusion channel extending in a horizontal direction in the ceramic member and below the bias electrode layer, the gas diffusion channel having a main path and a plurality of branch paths branched from the main path;

a gas inlet extending in a longitudinal direction from the back surface to the gas diffusion channel in the ceramic member; and a plurality of gas outlets communicating with the gas diffusion channel, each gas outlet having a cavity portion extending in the horizontal direction from at least one of the branch paths and a porous portion extending in the longitudinal direction from the cavity portion to the substrate supporting surface and filled with a ceramic porous material.

14

(Appendix 12)

The electrostatic chuck of appendix 11, wherein the cavity portion has a longitudinal dimension of less than 180 μm.

(Appendix 13)

The electrostatic chuck of appendix 11 or 12, wherein the cavity portion has a longitudinal dimension that is the same as a longitudinal dimension of a corresponding branch path.

(Appendix 14)

The electrostatic chuck of any one of appendices 11 to 13, wherein the branch path has a longitudinal dimension smaller than a longitudinal dimension of the main path.

(Appendix 15)

The electrostatic chuck of any one of appendices 11 to 14, wherein the porous portion extends from a position below the bias electrode layer to the substrate supporting surface.

(Appendix 16)

The electrostatic chuck of any one of appendices 11 to 15, wherein the cavity portion extends in the horizontal direction from at least two of the branch paths.

(Appendix 17)

The electrostatic chuck of any one of appendices 11 to 15, further comprising:

additional gas diffusion channel extending in the horizontal direction in the ceramic member and below the bias electrode layer, wherein the additional gas diffusion channel has additional main path and a plurality of additional branch paths branched from the additional main path, and the cavity portion extends in the horizontal direction from at least one of the additional branch paths.

The present disclosure is not limited to the configuration described in the above embodiments, and other components can be combined with the configuration described in the above embodiments. The above embodiments can be modified without departing from the scope of the present disclosure, and can be appropriately determined according to the form of the application.

The invention claimed is:

1. A plasma processing apparatus comprising:

a plasma processing chamber;

a substrate support disposed in the plasma processing chamber, and the substrate support including:

a ceramic member having a substrate supporting surface and a back surface;

a chuck electrode layer disposed below the substrate supporting surface in the ceramic member;

a bias electrode layer disposed below the chuck electrode layer in the ceramic member;

a gas diffusion channel horizontally extending in the ceramic member and below the bias electrode layer, the gas diffusion channel having a main path and a plurality of branch paths branched from the main path;

a gas inlet vertically extending from the back surface to the gas diffusion channel in the ceramic member; and a plurality of gas outlets communicating with the gas diffusion channel, each gas outlet having a cavity portion horizontally extending from at least one of the branch paths and a porous portion (i) having a bottom surface that faces the cavity portion and (ii) vertically extending from the cavity portion to the substrate supporting surface and filled with a ceramic porous material;

a heat transfer gas supply configured to supply a heat transfer gas to the gas inlet;

a DC power supply configured to apply a DC voltage to the chuck electrode layer; and a bias power supply configured to apply a voltage pulse sequence to the bias electrode layer, wherein each of the plurality of branch paths has a height dimension that is smaller than a height dimension of the main path.

2. The plasma processing apparatus of claim 1, wherein the cavity portion has a vertical dimension of less than 180 μm.

3. The plasma processing apparatus of claim 1, wherein the cavity portion has a vertical dimension that is the same as a vertical dimension of a corresponding branch path.

4. The plasma processing apparatus of claim 3, wherein the branch path has a vertical dimension smaller than a vertical dimension of the main path.

5. The plasma processing apparatus of claim 1, wherein the porous portion extends from a position below the bias electrode layer to the substrate supporting surface.

6. The plasma processing apparatus of claim 1, wherein the cavity portion horizontally extends from at least two of the branch paths.

7. The plasma processing apparatus of claim 1, wherein the substrate support further includes an additional gas diffusion channel horizontally extending in the ceramic member and below the bias electrode layer, the additional gas diffusion channel has an additional main path and a plurality of additional branch paths branched from the additional main path, and the cavity portion horizontally extends from at least one of the additional branch paths.

8. The plasma processing apparatus of claim 1, wherein the ceramic member further includes a ring supporting surface, and the substrate support includes:

at least one edge ring disposed on the ring supporting surface to surround a substrate on the substrate supporting surface;

at least one annular chuck electrode layer disposed below the ring supporting surface in the ceramic member; and an annular bias electrode layer disposed below said at least one annular chuck electrode layer in the ceramic member.

9. The plasma processing apparatus of claim 8, wherein the substrate support includes:

a second gas diffusion channel horizontally extending in the ceramic member and below the annular bias electrode layer, the second gas diffusion channel having a second main path and a plurality of second branch paths branched from the second main path; and a plurality of second gas outlets communicating with the second gas diffusion channel, each second gas outlet having a second cavity portion horizontally extending from at least one of the second branch paths and a plurality of second gas outlets vertically extending from the second cavity portion to the ring supporting surface and filled with a ceramic porous material.

10. The plasma processing apparatus of claim 9, wherein the second cavity portion has a vertical dimension of less than 180 μm.

11. An electrostatic chuck for use in a plasma processing apparatus, comprising:

a ceramic member having a substrate supporting surface and a back surface;

a chuck electrode layer disposed below the substrate supporting surface in the ceramic member;

a bias electrode layer disposed below the chuck electrode layer in the ceramic member;

a gas diffusion channel horizontally extending in the ceramic member and below the bias electrode layer, the gas diffusion channel having a main path and a plurality of branch paths branched from the main path;

a gas inlet vertically extending from the back surface to the gas diffusion channel in the ceramic member; and a plurality of gas outlets communicating with the gas diffusion channel, each gas outlet having a cavity portion horizontally extending from at least one of the branch paths and a porous portion (i) having a bottom surface that faces the cavity portion and (ii) vertically extending from the cavity portion to the substrate supporting surface and filled with a ceramic porous material, wherein each of the plurality of branch paths has a height dimension smaller than a height dimension of the main path.

12. The electrostatic chuck of claim 11, wherein the cavity portion has a vertical dimension of less than 180 μm.

13. The electrostatic chuck of claim 12, wherein the cavity portion has a vertical dimension that is the same as a vertical dimension of a corresponding branch path.

14. The electrostatic chuck of claim 13, wherein the branch path has a vertical dimension smaller than a vertical dimension of the main path.

15. The electrostatic chuck of claim 11, wherein the porous portion extends from a position below the bias electrode layer to the substrate supporting surface.

16. The electrostatic chuck of claim 11, wherein the cavity portion horizontally extends from at least two of the branch paths.

17. The electrostatic chuck of claim 11, further comprising:

an additional gas diffusion channel horizontally extending in the ceramic member and below the bias electrode layer, wherein the additional gas diffusion channel has additional main path and a plurality of additional branch paths branched from the additional main path, and the cavity portion horizontally extends from at least one of the additional branch paths.

18. The plasma processing apparatus of claim 1, wherein the cavity portion has a vertical dimension that is the different from a vertical dimension of a corresponding branch path.

* * * * *